(12) United States Patent
Russ et al.

(10) Patent No.: US 6,909,149 B2
(45) Date of Patent: Jun. 21, 2005

(54) LOW VOLTAGE SILICON CONTROLLED RECTIFIER (SCR) FOR ELECTROSTATIC DISCHARGE (ESD) PROTECTION OF SILICON-ON-INSULATOR TECHNOLOGIES

(75) Inventors: Cornelius Christian Russ, Diedorf (DE); Phillip Czeslaw Jozwiak, Plainsboro, NJ (US); Markus Paul Josef Mergens, Ravensburg (DE); John Armer, Middlesex, NJ (US); Cong-Son Trinh, Plainsboro, NJ (US); Russell Mohn, Plainsboro, NJ (US); Koen Gerard Maria Verhaege, Gistel (BE)

(73) Assignees: Sarnoff Corporation, Princeton, NJ (US); Sarnoff Europe BVBA, Gistel (BE)

( * ) Notice: Subject to any disclaimer, the term of this patent is extended or adjusted under 35 U.S.C. 154(b) by 0 days.

(21) Appl. No.: 10/825,780

(22) Filed: Apr. 15, 2004

(65) Prior Publication Data

US 2004/0207021 A1 Oct. 21, 2004

Related U.S. Application Data

(60) Provisional application No. 60/463,461, filed on Apr. 16, 2003.

(51) Int. Cl.[7] ............................................. H01L 23/62
(52) U.S. Cl. ..................................... 257/355; 257/173
(58) Field of Search ................................ 257/355, 173

(56) References Cited

U.S. PATENT DOCUMENTS

| | | | |
|---|---|---|---|
| 5,465,189 A | 11/1995 | Polgreen et al. | ............... 361/58 |
| 5,708,288 A | 1/1998 | Quigley et al. | ............. 257/355 |
| 5,872,379 A * | 2/1999 | Lee | ............................. 257/355 |
| 6,015,992 A | 1/2000 | Chatterjee et al. | ........... 257/350 |
| 6,242,763 B1 | 6/2001 | Chen et al. | .................. 257/107 |
| 6,274,910 B1 | 8/2001 | Yu | ............................. 257/355 |
| 6,429,505 B1 | 8/2002 | Kunikiyo | ..................... 257/577 |
| 6,521,952 B1 | 2/2003 | Ker et al. | .................... 257/360 |
| 6,573,566 B2 | 6/2003 | Ker et al. | .................... 257/355 |
| 2003/0146474 A1 | 8/2003 | Ker et al. | .................... 257/347 |

FOREIGN PATENT DOCUMENTS

EP 0 852 400 7/1998 ........... H01L/27/02

* cited by examiner

Primary Examiner—David Nelms
Assistant Examiner—Tu-Tu Ho
(74) Attorney, Agent, or Firm—William J. Burke

(57) ABSTRACT

A silicon-on-insulator (SOI) electrostatic discharge (ESD) protection device that can protect very sensitive thin gate oxides by limiting the power dissipation during the ESD event, which is best achieved by reducing the voltage drop across the active (protection) device during an ESD event. In one embodiment, the invention provides very low triggering and holding voltages. Furthermore, the SOI protection device of the present invention has low impedance and low power dissipation characteristics that reduce voltage build-up, and accordingly, enable designers to fabricate more area efficient protection device

31 Claims, 7 Drawing Sheets

LOW VOLTAGE SILICON CONTROLLED RECTIFIER (SCR) FOR ELECTROSTATIC DISCHARGE (ESD) PROTECTION OF SILICON-ON-INSULATOR TECHNOLOGIES

CROSS REFERENCES

This patent application claims the benefit of U.S. Provisional Application Ser. No. 60/463,461, filed Apr. 16, 2003, the contents of which are incorporated herein by reference in its entirety.

FIELD OF THE INVENTION

This invention generally relates to the field of electrostatic discharge (ESD) protection circuitry, and more specifically, for ESD protection for silicon-on-insulator (SOI) technologies.

BACKGROUND OF THE INVENTION

Integrated circuits (IC's) and other semiconductor devices are extremely sensitive to the high voltages that may be generated by contact with an ESD event. As such, electrostatic discharge (ESD) protection circuitry is essential for integrated circuits. An ESD event commonly results from the discharge of a high voltage potential (typically, several kilovolts) and leads to pulses of high current (several amperes) of a short duration (typically, 100 nanoseconds). An ESD event is generated within an IC, illustratively, by human contact with the leads of the IC or by electrically charged machinery being discharged in other leads of an IC. During installation of integrated circuits into products, these electrostatic discharges may destroy the IC's and thus require expensive repairs on the products, which could have been avoided by providing a mechanism for dissipation of the electrostatic discharge to which the IC may have been subjected.

The ESD problem has been especially pronounced in silicon-on-insulator (SOI) complementary metal oxide semiconductor (CMOS) field effect technologies, which require new considerations and approaches for ESD protection. An SOI technique involves embedding an insulation layer, such as silicon dioxide ($SiO_2$), having a thickness of approximately 100–400 nanometers (nm) between a semiconductor device region (e.g., active region of a transistor) and the substrate.

However, the thermal properties of the extremely thin active silicon film layer are poor in terms of thermal conductivity. Specifically, silicon dioxide ($SiO_2$) has a very poor thermal conductivity compared to silicon. As a consequence, the active device region is thermally isolated from the substrate disposed below the insulating layer. Therefore, when an ESD event occurs, heat generated at the ESD device (e.g., an SCR) can not be dissipated by the substrate. Accordingly, during an ESD event, an active area of the ESD device is subject to excessive heat, which may cause damage to the ESD device.

Furthermore low voltage ESD current conduction is also required in order to protect very thin gate oxides. Such thin gate oxides typically have a thickness of 0.8 to 2.4 nanometers, and are typically used in advanced SOI processes, since SOI has significant advantages for high speed IC applications. In addition to providing ESD protection for the very thin gate oxides, it is also desirable that the trigger voltage be very low and that any trigger overshoot is limited as much as possible. Therefore, there is a need in the art to limit power dissipation across the active region of an SOI ESD protection device, as well as providing very fast triggering capabilities for the SOI protection device during an ESD event.

SUMMARY OF INVENTION

The disadvantages heretofore associated with the prior art are overcome by the present invention of a silicon-on-insulator (SOI) electrostatic discharge (ESD) protection device that can protect very sensitive thin gate oxides by limiting the power dissipation during the ESD event, which is best achieved by reducing the voltage drop across the active (protection) device during an ESD event. In one embodiment the invention provides very low triggering and holding voltages. Furthermore, the silicon-on-insulator (SOI) protection device of the present invention has low impedance and low power dissipation characteristics that reduce voltage build-up, and accordingly, enable designers to fabricate more area efficient protection devices.

In one embodiment, the present invention includes an electrostatic discharge (ESD) protection circuit in a semiconductor integrated circuit (IC) having protected circuitry, where the ESD protection circuit comprises a silicon controlled rectifier (SCR) for shunting ESD current away from the protected circuitry. The SCR comprises a substrate, an N-well, and an adjacent P-well formed over the substrate, where the N-well and P-well define a PN junction therebetween. An insulator layer is formed over the substrate and electrically isolates the N-well and P-well from the substrate.

An N+ cathode region is formed in the P-well and for coupling to ground, and a P+ anode region is formed in the N-well and for coupling to a pad of the protected circuitry. At least one P+ trigger tap region is disposed in the P-well and spaced proximate to the N+ cathode region, where the at least one P+ trigger tap is adapted to trigger the SCR. Further, at least one N+ trigger tap region is disposed in the N-well and spaced proximate to the P+ anode region, where the at least one N+ trigger tap is adapted to trigger the SCR.

In another embodiment of the present invention, the SCR comprises a substrate, an N-well and an adjacent P-well is formed over the substrate and defines a PN junction therebetween. An insulator layer is formed over the substrate and electrically isolates the N-well and P-well from the substrate. An N+ cathode region is formed in the P-well and coupled to ground, and a P+ anode region is formed in the N-well and coupled to a pad of the protected circuitry.

The SCR further includes an integrated trigger device, where the integrated trigger device comprises an N+ drain region, formed in the P-well and coupled to the pad, and defines an NMOS channel therebetween the N+ cathode region. A gate region is coupled to the N+ cathode region and disposed over the NMOS channel. At least one P+ trigger tap region is disposed in the P-well and spaced proximate to the N+ cathode region and the N+ drain region, where the at least one P+ trigger tap is adapted to trigger the SCR. Further, at least one N+ trigger tap region is disposed in the N-well and spaced proximate to the P+ anode region, where the at least one N+ trigger tap is adapted to trigger the SCR.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, when possible, to designate identical elements that are common to the figures.

DETAILED DESCRIPTION OF THE INVENTION

The process steps and structures described below do not form a complete process flow for manufacturing integrated circuits (ICs). The present invention can be practiced in conjunction with silicon-on-insulator (SOI) integrated circuit fabrication techniques currently used in the art, and only so much of the commonly practiced process steps are included as are necessary for an understanding of the present invention. The figures representing cross-sections and layouts of portions of an IC during fabrication are not drawn to scale, but instead are drawn so as to illustrate the important features of the invention. Furthermore, where possible, the figures illustratively include a schematic diagram of the circuitry (e.g., an SCR circuit) as related to the P and N-type doped regions of the integrated circuit.

The present invention is described with reference to SOI CMOS devices. However, those of ordinary skill in the art will appreciate that selecting different dopant types and adjusting concentrations allows the invention to be applied to NMOS, PMOS, and other processes that are susceptible to damage caused by ESD.

Figure 1A:
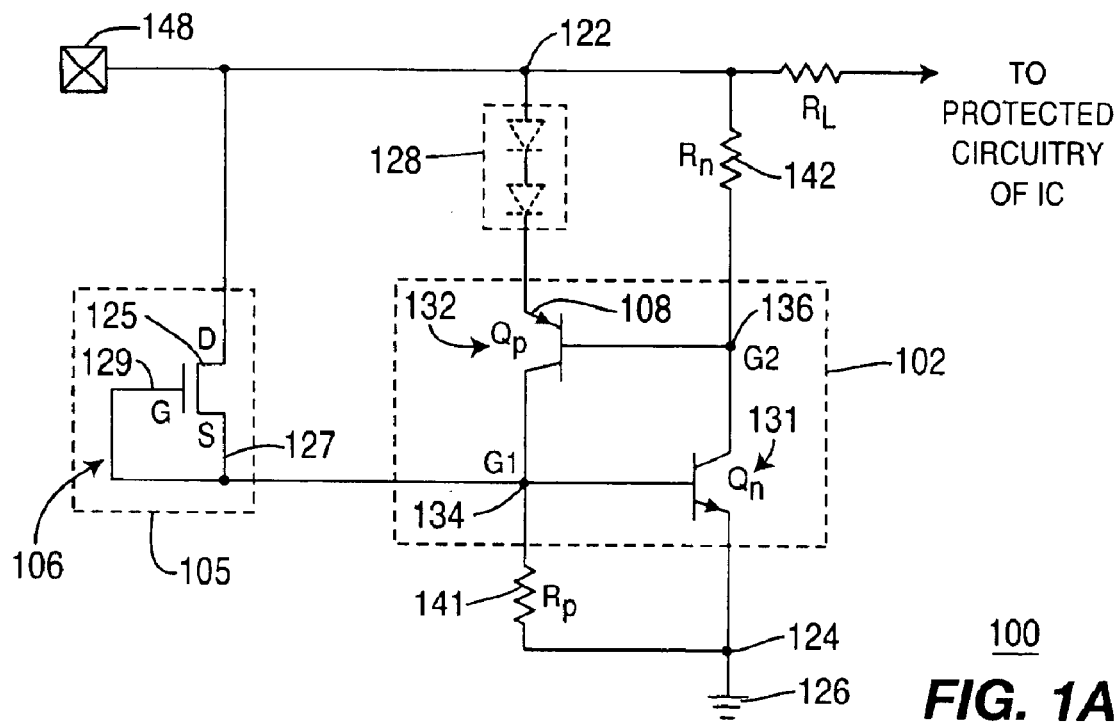
FIGS. 1A and 1B depict schematic diagrams of a silicon-on-insulator (SOI) SCR ESD protection device of the present invention having external on-chip triggering.
Figure 1B:
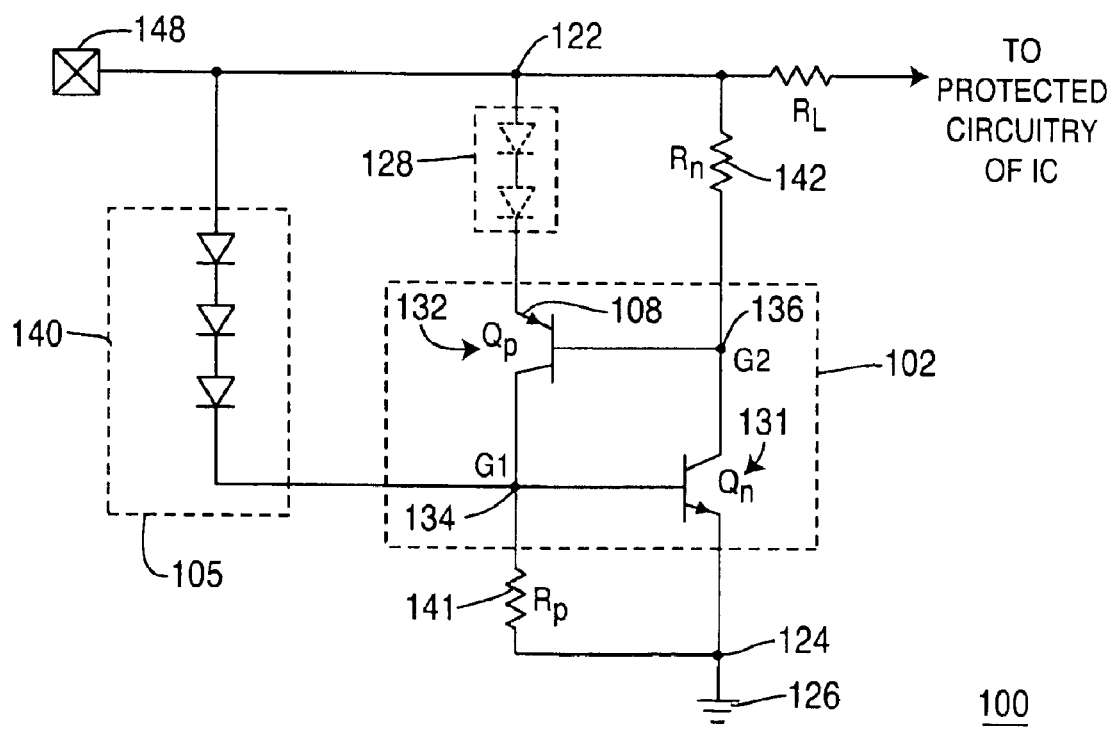

FIGS. 1A and 1B depict schematic diagrams of a silicon-on-insulator (SOI) SCR ESD protection device 100 of the present invention having external on-chip triggering. Each of the embodiments in schematic diagrams 1A and 1B illustratively depicts an IC pad 148 coupled to a trigger device 105 and an SCR 102. An optional current limiting resistor $R_L$ may be positioned between the circuitry to be protected and the SCR ESD protection device 201. The triggering device 105 and SCR 102 together serve as a protection device 100 for the circuitry on an integrated circuit (IC) (not shown). In particular, the triggering device 105 and SCR 102 protect the IC circuitry from electrostatic discharges (ESD) that may occur at the pad 148, which is coupled to the IC circuitry. When turned on, the SCR 102 functions as a shunt to redirect any ESD currents from the pad 148 to ground 126. The trigger device 105 turns on, that is, "triggers" the SCR 102 to quickly dissipate such overvoltage ESD condition.

Referring to the schematic diagram of FIG. 1A, the SCR protection device 100 includes an SCR 102 having an anode 122 connected to the pad 148, and a cathode 124 coupled to ground 126. The SCR 102 may be schematically represented by a PNP transistor Qp 132 and an NPN transistor Qn, as is conventionally known in the art.

In particular, the anode 122 is coupled to an emitter 108 of the PNP transistor Qp 132, and optionally coupled to one side of an N-well resistance $R_n$ 142. The resistor $R_n$ 142 represents the N-well resistance in a base of the PNP transistor Qp 132 of the SCR 102, which is discussed in further detail below.

The collector of the PNP transistor Qp 132 is connected to a first node 134, which is also connected to the base of the NPN transistor Qn 131, as well as to one side of a resistor $R_p$ 141, and to the trigger 105 (discussed below). A second node 136 includes the base of the PNP transistor Qp 132, the other side of the resistor $R_n$ 142, and the collector of a NPN transistor Qn 131. The other side of resistor $R_p$ 141 is connected to a third node 124, which is coupled to ground 126. The resistor $R_p$ 141 represents a substrate resistance in a base of a transistor Qp 131 of the SCR 102, which is discussed in further detail below. Furthermore, the emitter of the PNP transistor Qp 131 is also connected to the grounded third node 124, which functions as the cathode of the SCR device 102. It is noted that the first node 134 and second node 136 represent first and second triggering gates G1 and G2 of the SCR 102.

Optionally, a number of serially connected diodes 128 (e.g., two diodes drawn in phantom) may be coupled in a forward conductive direction from the anode 122 to the emitter 108 of the PNP transistor Qp 132. The serially connected diodes 128 (typically 1–4 diodes) may be provided to increase the holding voltage of the SCR 102, as may be required to fulfill latch-up specifications.

The triggering device 105 in the schematic diagram A is an external, on-chip, trigger device, as opposed to a triggering device integrated with the SCR 102. In one embodiment, the triggering device 105 includes a grounded-gate NMOS transistor 106, where the gate 129 is connected to the source 127, while the drain 125 of the NMOS transistor 106 is coupled to the pad 148. Specifically, the gate 129 is connected to the source 127 to turn off any MOS current, and the source 127 and the gate 129 of the NMOS transistor 206 are coupled to the base of the NPN transistor Qn 131 at the first node (first gate G1) 136 of the SCR 102. For a detailed understanding of utilizing a grounded-gate trigger device to trigger an SCR 102, the reader is directed to commonly assigned U.S. patent application Ser. No. 10/007,833, filed Nov. 5, 2001.

The schematic diagram of FIG. 1B is the same as the schematic diagram shown in FIG. 1A, except that a different triggering device 105 is being employed to trigger the SCR 102. That is, the exemplary trigger device 105 comprises a plurality of external on-chip diodes 140 serially coupled in a forward conduction direction from the pad 148 to the first node 134 (i.e., the base of the NPN transistor Qn 131 forming the first gate G1). The number of serially coupled diodes 140 determines the triggering voltage of the SCR 102. In the exemplary embodiment of FIG. 1B, three serially coupled diodes are illustratively shown. The SCR 102 will trigger when a voltage at the pad 148 exceeds approximately 2.8 volts (the three serially coupled diodes 140 plus the base-emitter diode of the NPN transistor Qn 131, where each diode has a forward biasing voltage of approximately 0.7 volts). For a detailed understanding of utilizing trigger diodes to trigger an SCR 102, the reader is directed to commonly assigned U.S. patent application Ser. No. 10/099, 600, filed Mar. 15, 2002.

Furthermore, a person skilled in the art for which this invention pertains will appreciate that a PMOS triggered SCR ESD protection device may be utilized. Moreover, a person skilled in the art will recognize that a NMOS or PMOS transistor with drain-bulk-gate coupling, two cascoded NMOS or PMOS transistors, or other external on-chip triggering devices 205 may used as part of the ESD protection device 100, as discussed above.

Figure 2A:
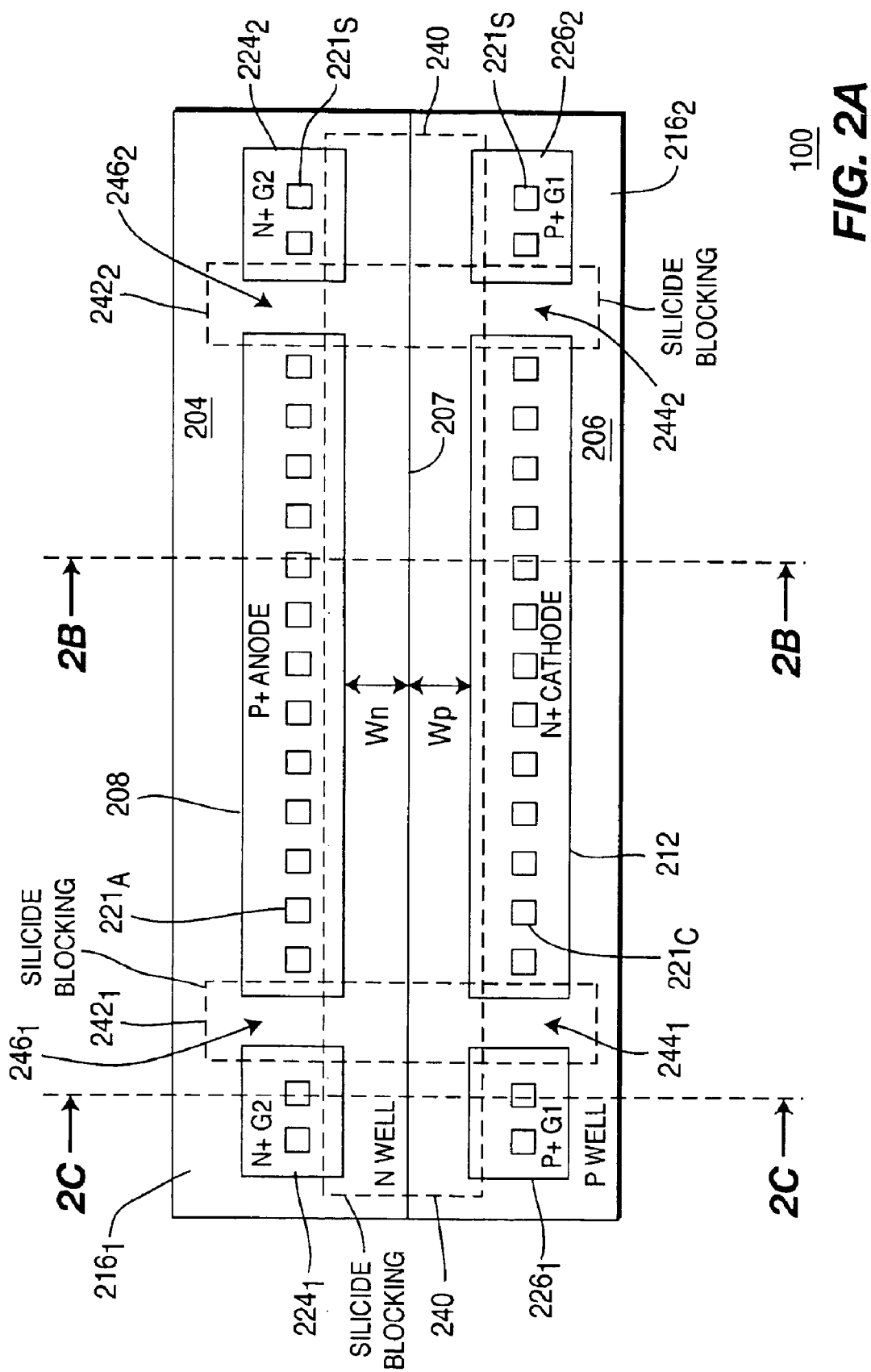
FIG. 2A depicts a top view of a first embodiment of the SOI-SCR of the present invention.
Figure 2B:
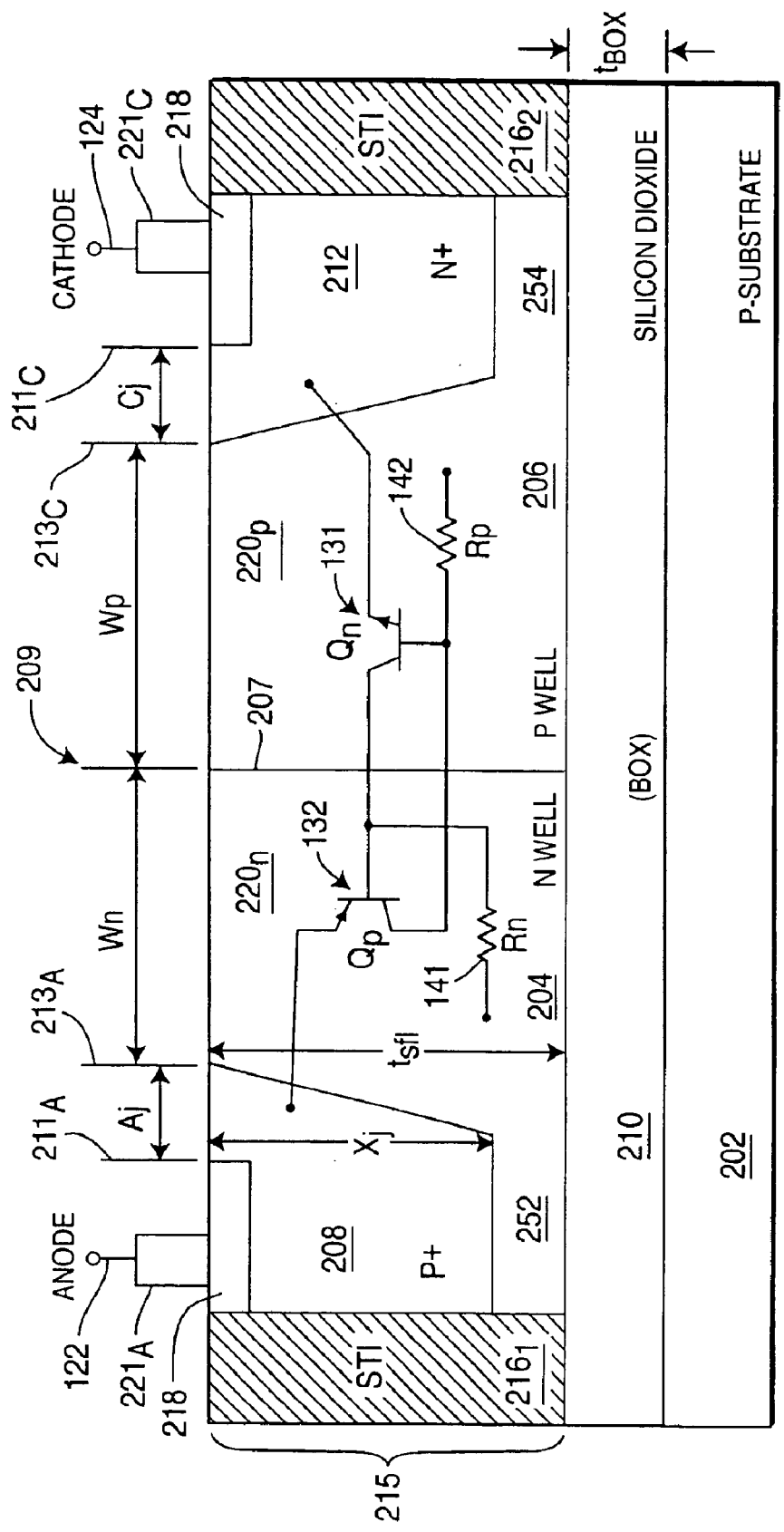
FIGS. 2B and 2C depict cross-sectional views respectively taken along lines A—A and B—B of the SOI-SCR of FIG. 2A.
Figure 2C:
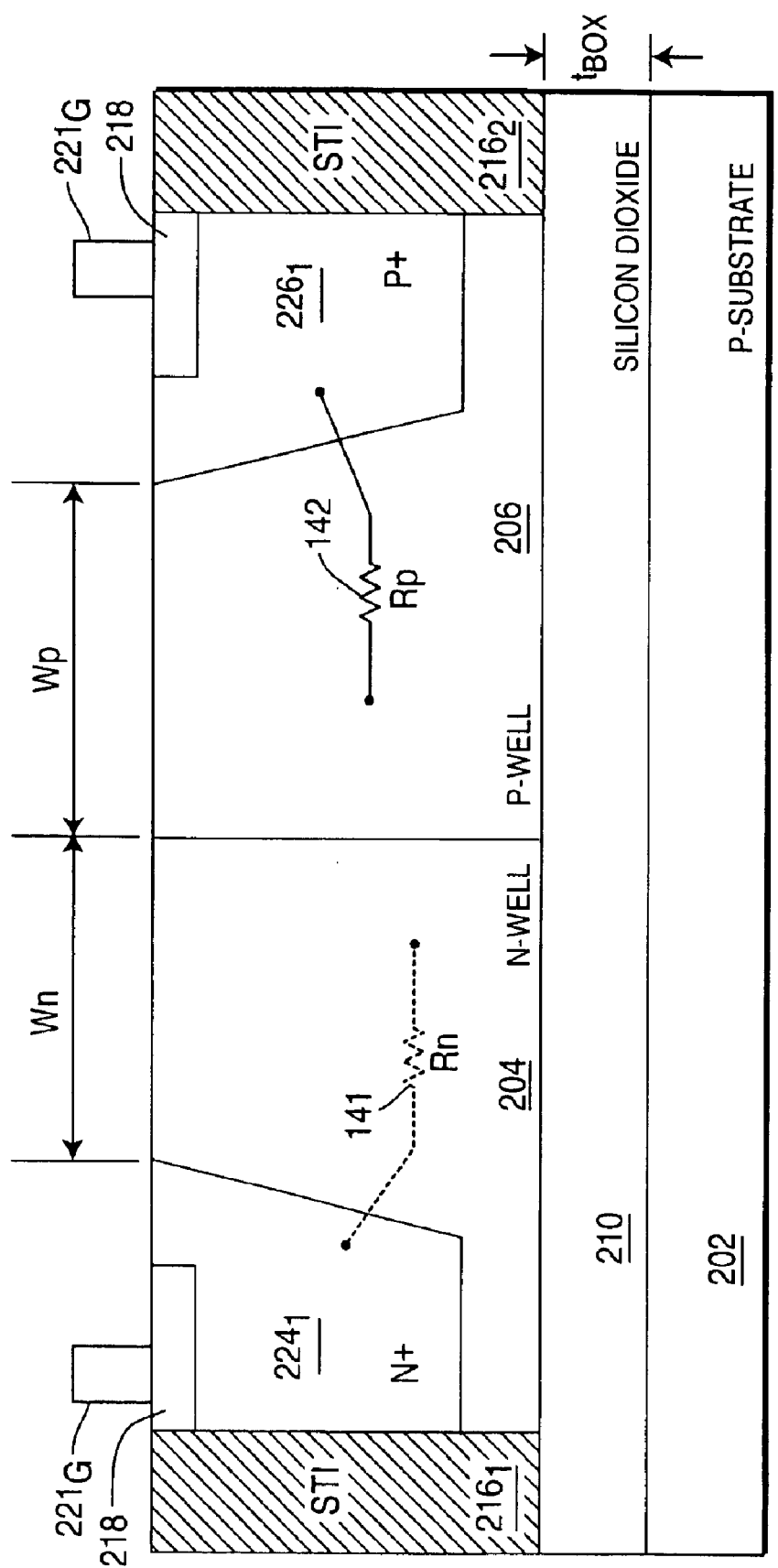

FIG. 2A depicts a top view of a first embodiment of the SOI-SCR 200 of the present invention. FIGS. 2B and 2C depict cross-sectional views respectively taken along lines A—A and B—B of the SOI-SCR of FIG. 2A, and should be viewed in conjunction with FIG. 2A. This exemplary first embodiment of the SOI-SCR 102 is coupled to an external on-chip triggering device, such as an exemplary on-chip triggering device 105 of FIGS. 1A and 1B.

Referring to FIG. 2B, the protection device 200 includes, in part, a P-type substrate 202, a buried insulative layer 210, an N-well 204, and a P-well 206. The buried insulative layer 210 is formed over the P-substrate 202, and the N-well 204 and P-well 206 is formed over the buried insulative layer 210. It is noted that the buried insulative layer 210 is illustratively fabricated from silicon dioxide ($SiO_2$), sapphire (SOS), among other insulative materials.

The SOI-SCR 100 structure is generally fabricated by forming the buried insulative layer (e.g., $SiO_2$, hereinafter buried oxide (BOX) layer) 210 over the P-subtrate 202, over which a thin layer 215 of undoped silicon (e.g., monocrystaline, uniform silicon) is formed. In one embodiment, the BOX layer 210 is formed by implanting and annealing oxygen atoms in a wafer to form the silicon dioxide layer 210 therein. The thickness ($t_{BOX}$) of the BOX layer 210 is typically in a range of approximately 100 to 400 nanometers (nm).

Shallow trench isolation (STI) 216 is provided by locally etching trenches into the silicon film layer 215 until the BOX layer 210 is reached. In particular, trenches are etched in specific areas, an insulator material (e.g., silicon dioxide ($SiO_2$)) is illustratively deposited, and the surface is then planarized. The portion of the silicon layer 215 not filled by the STI insulator material is utilized to deploy an active region in which the active transistors and devices are formed. Typically, shallow trench isolation (STI) 216 is used to separate regions that will receive high doping. It is noted that the high doped regions may also be separated by other techniques known in the art, which are beneficial to the SCR operation.

Ion implanting is then provided to the undoped silicon regions to form the P-well 206 and N-well 204 doped regions using conventional masking techniques known in the art. Referring to FIG. 2B, the N-well 204 and P-well 206 are formed adjacent to each other and define a junction 207 at the adjoining boundary. Furthermore, looking from left to right in FIG. 2B, a first STI region $216_1$ is formed to the left of the N-well region 204 and the first P+ doped region 208, while a second STI region $216_2$ is formed to the right of the P-well region 206 and the first N+ region 212. As such, a surface region 209, which is located between the anode 122 and cathode 124, does not have any trench etched regions, high-doped regions, or insulative material deposited therebetween. Accordingly, the entire device cross-section including the surface region 209, which extends over an N-well region $220_N$ and a P-well region $220_P$ (collectively non-high-doped region 220), may be utilized for SCR conduction.

N+ and P+ implanting and annealing steps are also conducted after the STI region and well region formations to form the high-doped N+ and P+ regions, respectively. The implantations are performed through separate photo masks for the N+ and P+ to allow the dopands to penetrate only into the dedicated regions of the IC. The regions denoted P+ and N+ are regions having higher doping levels than the N-well and P-well regions 204 and 206. In the exemplary SCR 102 embodiment of the present invention, at least one P+ region 208 is provided in the N-well 204 to form the anode 122, and at least one N+ region 212 is provided in the P-well 206 to form the cathode 124 of the SCR 102.

Additionally, referring to FIG. 2C, at least one P+ region 226 is also implanted in the P-well 206 to form a first trigger gate G1 134 of the SCR 102. Similarly, at least one N+ region 224 is implanted in the N-well 204 to form a second trigger gate G2 136 of the SCR 102. Thermal diffusion and dopant activation steps are performed after completing the implantations, as conventionally known in the art.

Referring to FIG. 2A, the P+ region 208 is rectangular in shape (e.g., a stripe) and serves as the anode 122 of the SCR 102. Similarly, the N+ region 212 is also rectangular in shape (e.g., a stripe) and serves as the cathode 124 of the SCR 102. In one embodiment, the width of the anode and cathode regions 208 and 212 is in a range of approximately ten (10) to fifty (50) micrometers. Each of a pair of P+ regions $226_1$ and $226_2$ (collectively P+ regions 226) is formed in the P-well 206, while each of a pair of N+ region $224_1$ and $224_2$ (collectively N+ regions 224) is formed in the N-well 204. As mentioned above, the pair of P+ regions 226 and the pair of N+ regions 224 respectively form the first and second trigger gates G1 and G2 (134 and 136) of the SCR 102. In one embodiment, the width of each trigger gate region $224_1/224_2$ and $226_1/226_2$ is in a range of approximately one (1) to five (5) micrometers.

The P+ regions 226 forming the first gate G1 are disposed in close proximity to the N+ region 212 (e.g., along the axis of the N+ stripe region 212). The P+ regions 226 are also aligned with the N+ regions 212. By disposing the P+ regions 226 in close proximity to the N+ region 212, the base resistance from the first gate G1 to the intrinsic base node of the NPN transistor Qn 131 is reduced. A P-well spacing 244 is defined by the P-well material 206 formed between the P+ region 226 and the N+ region, and is preferably minimal in size. The P+ region 226 of the first gate G1, combined with the adjacent P-well spacing 244 and the N+ regions 212 together form a diode, which is forward biased when a positive voltage appears on the P+ region 226. In particular, the triggering device 105 acts as a current source at the base of the NPN transistor Qn 131, by injecting majority carriers (holes) into the P-type base material, which forward biases the base-emitter (P-well spacing/region 244/206 and N+ 212) of the NPN transistor Qn 131. Furthermore, for normal circuit operation (i.e. no ESD event), the close proximity of the P+ regions 226 (first gate G1) to the SCR 102 and the N+ emitter regions 212 of the SCR 102 is advantageous as will be described in further detail hereafter.

The N+ regions $224_1$ and $224_2$ (second gate G2) are formed in a similar manner as discussed above with respect to the P+ regions 226. That is, the N+ regions 224 are positioned proximate and in-line (e.g., axially in-line) with the P+ anode region 208 of the SCR 102, such that N-well spacings $246_1$ and $246_2$ are respectively defined therebetween each end of the P+ anode region 208 and adjacent N+ regions $224_1$ and $224_2$. It is noted that in one embodiment, the second gate G2 is typically utilized to couple a PMOS trigger device 105 to the SCR 102.

Referring to FIGS. 2B and 2C, a silicide layer 218 is formed over a portion of each of the N+ regions (e.g., N+ regions 212 and 224) and P+ regions (e.g., P+ regions 208 and 226). In particular, a conductive layer (e.g., using cobalt, titanium, and the like) is formed on the surface of the IC 200. A silicide blocking-mask is provided to block unwanted silicide layers over certain areas of the IC. The silicide layers 218 are formed in a conventional manner known in the art, and serve as a conductive material respectively for each metal contact $221_A$, $221_C$, and $221_S$ (collectively metal contacts 221) at the anode 122, cathode 124, and trigger gates 224 and 226. The metal contacts 221 are used to connect the semiconductor regions to the respective circuit nodes of the integrated circuit that is being protected. By using the silicide layers 218 only in certain parts of region 208 (e.g., for the anode 122) and region 212 (e.g., for the cathode 124), the risks of a shorting between the anode 122 and the surface of region $220_N$ (FIG. 2B), and between the cathode 124 and the surface of region $220_P$ (e.g., from thermal and mechanical stresses) is greatly reduced.

Referring to FIGS. 2A and 2B, a surface region 209 formed between the P+ anode 208 and N+ cathode 212 is silicide blocked, as illustratively shown by the rectangular area 240 (drawn horizontally in phantom). Additionally, a surface region between the second trigger gates G2 224 and the P+ anode 208 are also silicide blocked. Similarly, surface regions between the first trigger gates G1 226 and the N+ cathode 212 are also silicide blocked. As shown in the exemplary embodiment of FIG. 2A, a first rectangle area $242_1$ (drawn vertically in phantom) illustrates a first area that is silicide blocked across the N-well 204 and P-well 206, between the second gate G2 $224_1$ and the P+ anode region 208, as well as the first gate G1 $226_1$ and the N+ anode region 206. Similarly, a second rectangle area $242_2$ (drawn vertically in phantom) illustrates a second area that is silicide blocked across the N-well 204 and P-well 206, between the second gate G2 $224_2$ and the P+ anode region 208, as well as the first gate G1 $226_2$ and the N+ anode region 206.

The illustrative schematic diagram in FIGS. 2A–2C represent the components of the SCR 102 of which correspond to the schematic diagrams in FIG. 1A. That is, FIGS. 2A–2C are illustrated and discussed as an SCR 102 with an NMOS triggering device having the source and gate connected together. However, a person skilled in the art will understand that where a PMOS triggering device is used, the N- and P-type regions illustratively shown in FIGS. 2A–2C, as well as the potentials and terminals are reversed. Referring to FIG. 2B, the NPN transistor Qn 131 is formed by the N+ region 212 (emitter), the P-well 206 (base) and the N-well 204 (collector). The PNP transistor Qp 132 is formed by the P+ region 208 (emitter), the N-well 204 (base), and the P-well region 206 (collector). It should be noted that the N-well 204 serves dual functions as the collector of the NPN transistor Qn 131, as well as the base of the PNP transistor Qp 132. Likewise, the P-well 206 serves dual functions as the collector of the PNP transistor Qp 132, as well as the base for the NPN transistor Qn 131.

The N-well 204 has an intrinsic resistance, which is observed as the well or as the base resistance $R_n$ 142 of the PNP transistor Qp 132. Likewise, the P-well 206 has an intrinsic resistance, which is observed as the base resistance $R_p$ 141 of the NPN transistor Qn 131. For either N-well or P-well, the associated well resistance values depend on the doping levels, as well as the length and cross sectional area of the N-well 204 and of the P-well 206. Typically, the well resistance $R_n$ 142 and $R_p$ 141 have resistance values in a range of 500 to 5000 ohms for a silicon material.

It is noted that in FIGS. 1A and 1B, the well resistance $R_n$ 142 is shown as being formed between the second gate 136 and the anode 122, and the well resistance $R_p$ 141 is shown as being formed between the first gate 134 and the cathode 124. However, one skilled in the art will appreciate that FIGS. 1A and 1B are simply equivalent schematic representations of the SCR circuitry, since the first P+ gate region 226 and second N+ gate region 224 are each formed in the same type of dopants. That is, the P+ first gate 226 is formed in the P-well 206 and the N+ second gate 224 is formed in the N-well 204. Accordingly, the intrinsic base resistances $R_n$ and $R_p$ also include the resistances associated with these high doped gate regions 226 and 224.

It is noted that the silicon film layer 215 has a thickness "$t_{SFL}$," and each of the high-doped regions (i.e., N+ region 212, and P+ regions 208) has a depth having a value "$X_j$", which is defined by the underlying semiconductor technology. In one embodiment, the depth $X_j$ is in the range of 0.1 to 0.3 microns. The thickness $t_{SFL}$ of the silicon film layer 215, as well as the depth of the N+ and P+ junction $X_j$ may vary from process type to process type. Accordingly, there may be SOI process versions where the N+ and/or P+ junctions will reach through to the BOX layer 210, without forming a metallurgical PN junction. Further, in instances where the N+ and/or P+ regions do not reach the BOX layer 210 (as shown in FIG. 2B), the depletion layer extending from the N+ and/or P+ region junctions into the SOI film (BOX) layer 210 may locally deplete the lowly doped N-well and/or P-well regions 252 and 254 (FIG. 2B) below these highly doped P+ and N+ doped regions 208 and 212.

In either case, the prior art SCRs will not work anymore. In particular, those SCR types relying on coupling through the N-well and/or P-well regions 252/254 under the highly doped P+ and N+ regions 208/212 will not be functional, since the lowly doped regions are either non-existent or depleted. This disadvantage of the prior art is avoided with the present SOI-SCR invention by implementing the trigger taps lateral and in-line (e.g., axially in-line) with the P+ anode stripe region 208 and N+ cathode stripe region 212, thereby ensuring the coupling into the lowly doped N-well and P-well regions 204 and 206 (i.e., the base regions for the PNP and NPN bipolar transistors 132 and 131). It is noted that another distinction between the present invention and prior art SCR devices is that the N-well and P-well regions 204 and 206 can be formed adjacent to each other in the same active area region.

Additionally, the distance from the silicided anode $211_A$ to the anode edge $213_A$ has a length "$A_j$". Likewise, the distance from the silicided cathode $211_C$ to the cathode edge $213_C$ has a length "$C_j$". The lengths $A_j$ and $C_j$ are maintained within a particular range to reduce the possible detrimental impact of mechanical stress during the formation of the silicide 218, which could later lead to increased leakage currents. In particular, the physical lengths $A_j$ and $C_j$ are proportionally based on the height $X_j$ of the P+ and N+ doped regions 208 and 212. The lengths $A_j$ and $C_j$ are in the range of two to five times the depth of the doped regions, where $A_j$ and $C_j$ are approximately equal. That is, $A_j$ and $C_j$ have values approximately in the range of $2X_j$ to $5 X_j$ (not shown to scale in FIG. 2B). Preferably, the distance $A_j$ from the silicided anode $211_A$ to the anode edge $213_A$, and distance $C_j$ from the silicided cathode $211_C$ to the cathode edge $213_C$ is equal to approximately three times the height $X_j$ ($3X_j$) of the high doped regions 208 and 212. By maintaining such distances between the anode 122 and junction 207, as well as the cathode 124 and junction 207, the probability of stress related leakage currents and shorting of the silicide layers 218 is greatly reduced.

It is noted that the layout shown and described in FIGS. 2A–2C may represent a basic cell module of the SCR 102, and that larger arrays of the SCR 102 may be fabricated by placing multiples of these cell modules in a row, or adding multiple rows. Furthermore, in such an array, all the anode, cathode, and first and second trigger gate regions (G1 and G2) are respectively coupled together (e.g., by external on-chip wiring). For example, the connections between multiples of the trigger taps G1 or G2 are respectively coupled together, which is crucial for triggering of the entire structure.

One objective of the present invention is to increase the speed in which the SCR 102 turns on. Decreasing the turn on time of the SCR 102 is realized by a reduction in the size of the respective base regions of the transistors Qn 131 and Qp 132 in the SCR 102. The dimensions $W_p$ and $W_n$ in FIGS. 2A to 2C represent the respective base widths of the NPN transistor Qn 131 and the PNP transistor Qp 132. Referring to FIG. 2B, the base width $W_n$ is measured from the edge 213$_A$ of the P+ anode region 208 to the junction 207. Similarly, the base width $W_p$ is measured from the edge 213$_C$ of the N+ cathode region 212 to the junction 207. Reducing the size (i.e., base width) of the base of each transistor Qn 131 and Qp 132 of the SCR 102 reduces the time it takes for the minority carriers to diffuse through these regions and reach the corresponding collector regions. The transistors Qp 132 and Qn 131 preferably have base widths $W_n$ and $W_p$ features that are as small as possible, as permitted by the semi-conductor process specifications.

The SCR turn on time (SCR$_{Ton}$) is proportionally related to the combined base widths of each SCR transistor Qn 131 and Qp 132. In particular, the turn on time $T_{on1}$ for the NPN transistor Qn 131 is proportionally related to the square of the base width $W_p$ of the NPN transistor Qn 131. Likewise, the turn on time $T_{on2}$ for the PNP transistor Qp 132 is proportional to the square of the base width $W_n$ of the PNP transistor Qp 132. As such, the turn on time of the SCR$_{Ton}$= $((T_{on1})^2+(T_{on2})^2)^{1/2}$.

Specifically, the reduction of the widths $W_n$ and $W_p$ of the transistor bases decreases the trigger speed. Furthermore, the reduced widths $W_n$ and $W_p$ increase the overall gain of the transistors Qn 131 and Qp 132 in the SCR 102 by decreasing the hole-electron recombination effect. The increased transistor current gains β help ensure that enough current is provided to forward bias the bases of each transistor Qn 131 and Qp 132, and thereby quickly and reliably activate the SCR 102.

During an ESD event, the trigger current is provided by an external trigger device 105 (e.g., NMOS device), and is injected illustratively into the first gate G1 (P+ regions 226) of the SCR 102. That is, the trigger current is injected as a base current into the base of the NPN transistor Qn 131. Specifically, the external triggering current is provided from the source of the NMOS trigger device 105, which goes into breakdown, and subsequently into snapback. The NMOS trigger device 105 ensures a low trigger voltage of the ESD protection element, since the trigger voltage is determined by the drain-source breakdown voltage (e.g., 3.5 volts) of the NMOS transistor 106, and not by the intrinsically high breakdown voltage of the SOI-SCR 102 (in the range of 10 to 20V). As discussed above, the inventive trigger device 105 and SCR 102 are respectively depicted as having an NMOS triggering device in FIG. 1A. However, one skilled in the art will recognize that a PMOS triggered SCR structure for ESD protection may be utilized.

Thus, the SOI-SCR 102 of the present invention has a low triggering voltage and holding voltage, since the holding voltage of the SCR 102 is inversely proportional to the gains β of Qn 131 and of Qp 132. Since the heat power dissipation is directly translated by the product of the current by the voltage (P=IV), the low holding voltage of the SOI-SCR 102 advantageously minimizes power dissipation during and ESD event. Moreover, the low triggering voltage and the low voltage at high current insures the voltage drop between the pad 148 and ground 126 doesn't exceed the critical voltage (breakdown) of the circuit elements or circuit devices to be protected.

Figure 3A:
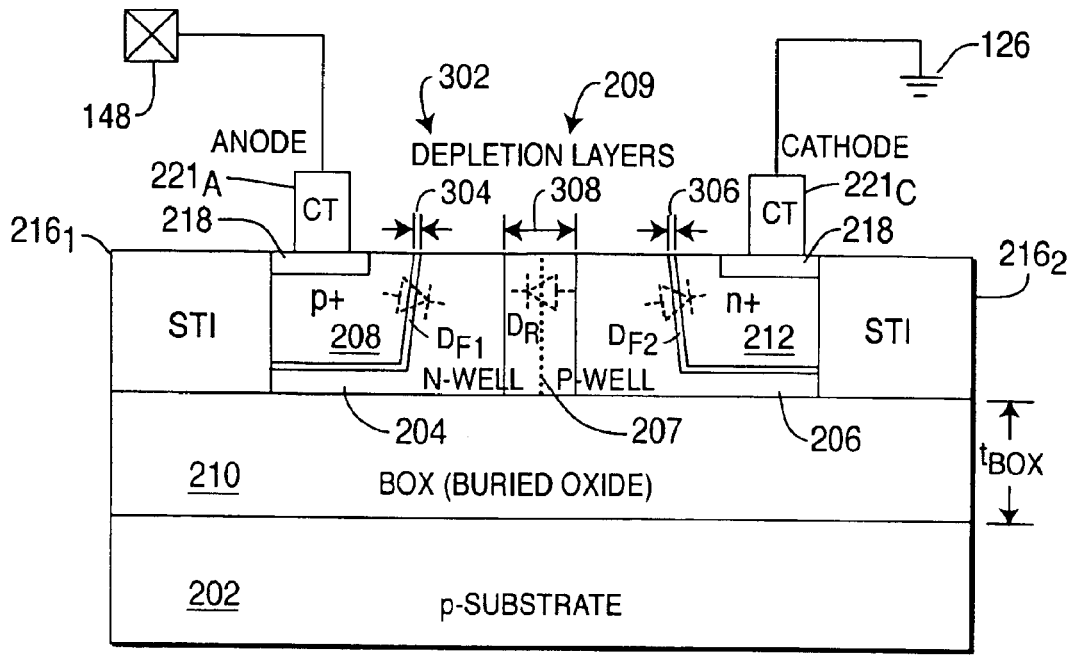
FIGS. 3A and 3B depict cross-sectional views of a second embodiment of an SOI-SCR of the present invention.
Figure 3B:
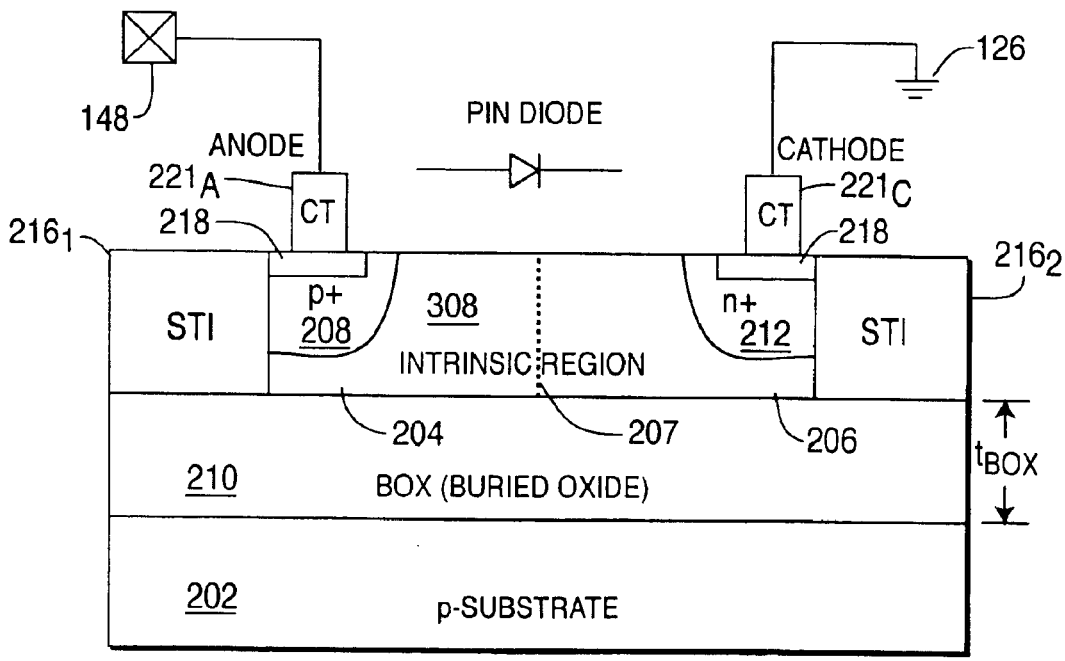

FIGS. 3A and 3B depict cross-sectional views of a second embodiment of an SOI-SCR 300 of the present invention. The second embodiment of the SOI-SCR 300 does not require any external or integrated triggering device 105, as discussed above with respect to the first embodiment, FIGS. 2A through FIGS. 2C. Rather, this second embodiment utilizes a triggering mechanism hereby termed as a "depletion and punch-through" triggering technique.

The cross-sectional layout of the second embodiment shown in FIGS. 3A and 3B is similar to the cross-sectional layout as shown in FIG. 2B of the first embodiment. In particular, a buried oxide (BOX) layer 210 is formed over P-substrate 202. An N-well 204 and adjacent P-well 206 are formed over the BOX layer 210 such that a junction 207 is formed therebetween. STI regions 216$_1$ and 216$_2$ are formed on opposing ends of the respective N and P-wells 204 and 206. A high doped P+ region 208 is formed in the N-well 204, and a high doped N+ region 212 is formed in the P-well 206, as discussed above with respect to FIG. 2B. Furthermore, the high doped P+ region 208 and N+ region 212 each have a silicide layer 218 to provide a bonding surface for the contacts 221 disposed over the P+ and N+ regions 208 and 212. The surface area 209 between the P+ anode region 208 and the N+ cathode region 212 is silicide blocked to prevent shorting, as discussed above with respect to FIGS. 2A–2C.

The P+ region 208 forms the anode of the SCR, while the N+ region 212 forms the cathode of the SOI-SCR 300. The N-well 204, P-well 206, and respective high doped regions 208 and 212 together form the active region 302 of the SOI-SCR 300. The P+ anode region 208 is adapted for coupling to a pad 148, while the N+ cathode region 212 is adapted for coupling to ground 126.

FIGS. 3A and 3B represent various stages of the SOI-SCR 300 when an ESD event occurs at the pad 148. It is noted that a built-in potential of a semiconductor PN junction, and/or an externally applied field across such PN junction, causes a depletion of free carriers in the layer on both sides of the junction. For example, a voltage occurring at the pad 148 causes a PN junction formed between the P+ region 208 and the N-well 204 to become forward biased, illustratively when the voltage exceeds 0.7 volts. As shown in FIG. 3A, a depletion layer 304, as illustratively depicted by diode D$_{F1}$ (drawn in phantom), forms at the junction between the P+ region 208 and the N-well 204, in an instance where the P+ anode 208 and the N-well 204 are at the same potential. Similarly, a depletion layer 306 forms between the P-well 206 and the N+ region 212, as illustratively shown by diode D$_{F2}$ (drawn in phantom), in an instance where the P-well 206 and N+ cathode region 212 are at a same potential. The size of the depletion layers 304 and 306 are dependent on the biasing direction at the junctions.

Furthermore, a PN junction 207 between the N-well 204 and P-well 206 is also represented by the diode D$_R$ (drawn in phantom), which has a depletion layer 308 that also grows as a function of the junction biasing. For any of the diodes D$_{F1}$, D$_{F2}$, and D$_R$, in an instance where the PN junction is forward biased (e.g., diodes $D_{F1}$ and $D_{F2}$), the width of the depletion layers are determined by the built-in potential, and are relatively narrow and vary slightly as a function of the external forward biasing. In instances where reverse biasing occurs, such as the reverse biasing of the diode $D_R$ region of the P and N-wells, the width of the depletion layer grows as a function of the applied reverse bias.

In particular, the compact dimensions $W_n$ and $W_p$ (e.g., approximately 0.3 micrometers) of the SOI-SCR 300, and the very low doping concentrations of the N-well 204 and P-well 206 (e.g., approximately $2\times10^{-17}$ cm$^3$) lead gradually to a complete depletion area as the voltage potential across the anode and cathode increases. As shown in FIG. 3A, the reverse biased N-well to P-well junction depletion layer 308 extends towards the depletion layers 304 and 306 respectively formed around the P+ region 208 of the anode and the P+ region 212 of the cathode.

Referring to FIG. 3B, once the voltage at the anode 122 is high enough that the depletion layer 308 "reaches through" to the forward biasing depletion layers 304 and 306, a "punched-through" condition arises. That is, the low doped N-well 204 and P-well 206 between the high doped P+ and N+ regions 208 and 212 are completely depleted of free carriers and become intrinsically conducting when the original N-well and P-well doping concentrations are "wiped out." Accordingly, the active area 302 of the SOI-SCR 300 acts as an intrinsic PIN diode in a strong forward conduction mode of operation, illustratively between the pad 148 and ground 126.

It is noted that the SOI-SCR of the present embodiment triggers at a voltage as low as between 1.5 to 3 volts, as opposed to approximately 15 volts for an externally triggered SCR having the same N-well and P-well doping concentrations. It is also noted that the operation of the "punched through" SOI-SCR 300 of the present invention operates differently than a conventional SCR device. Specifically, a conventional SCR, without the buried insulated layer 210, operates in a bi-polar transistor mode before triggering. In particular, the PNP and NPN bi-polar transistors representing the SCR conduct and provide feed-back (i.e., current gain) to each other in a conventional manner known in the art. Once the conventional SCR triggers, the PNP and NPN bi-polar transistor mode of operation ceases, and the SCR conducts the current to ground in the PIN diode mode of operation as discussed above. That is, the forward biasing of the P+ anode and N-well, the N+ cathode and P-well, as well as the reverse biasing of the N-well and P-well regions of the SCR deplete the free carriers, such that a PIN diode is formed between the P+ anode region and the N+ cathode regions.

By contrast, the SOI-SCR 300 of the present invention immediately goes into the depletion and "punch-through" mode of operation prior to triggering, and acts as a PIN diode after triggering of the SCR, as discussed above. Thus, the "punch-through" SOI-SCR 300 of the present invention triggers much faster than a conventional SCR, since the "punched-through" SOI-SCR does not operate in the bi-polar transistor mode prior to triggering.

Figure 4A:
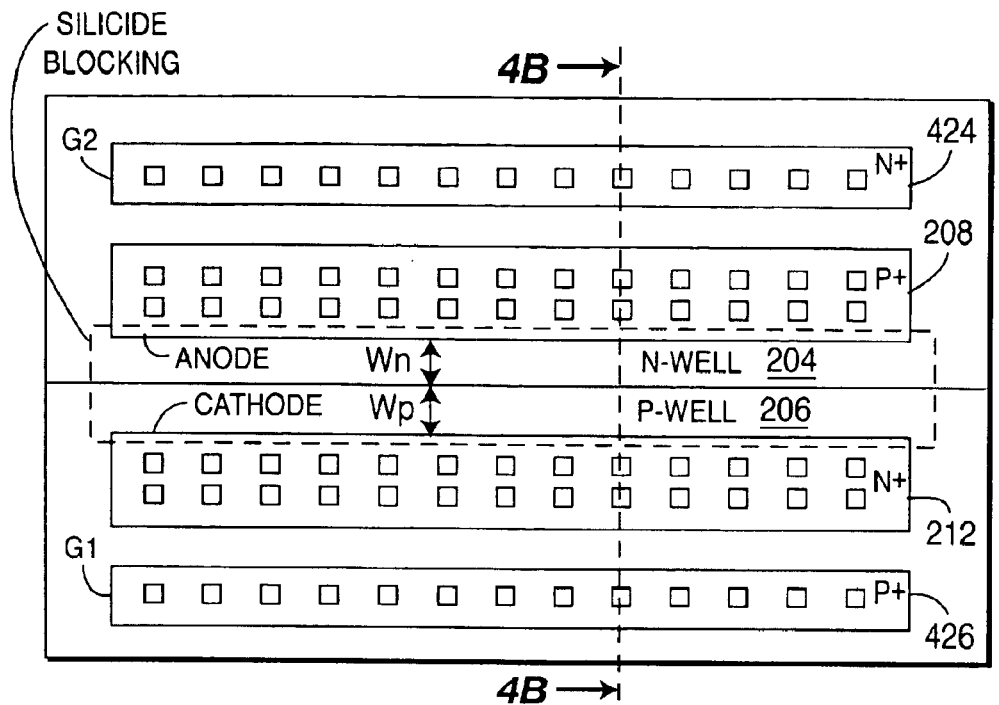
FIG. 4A depicts a top view of a third embodiment of the SOI-SCR of the present invention.
Figure 4B:
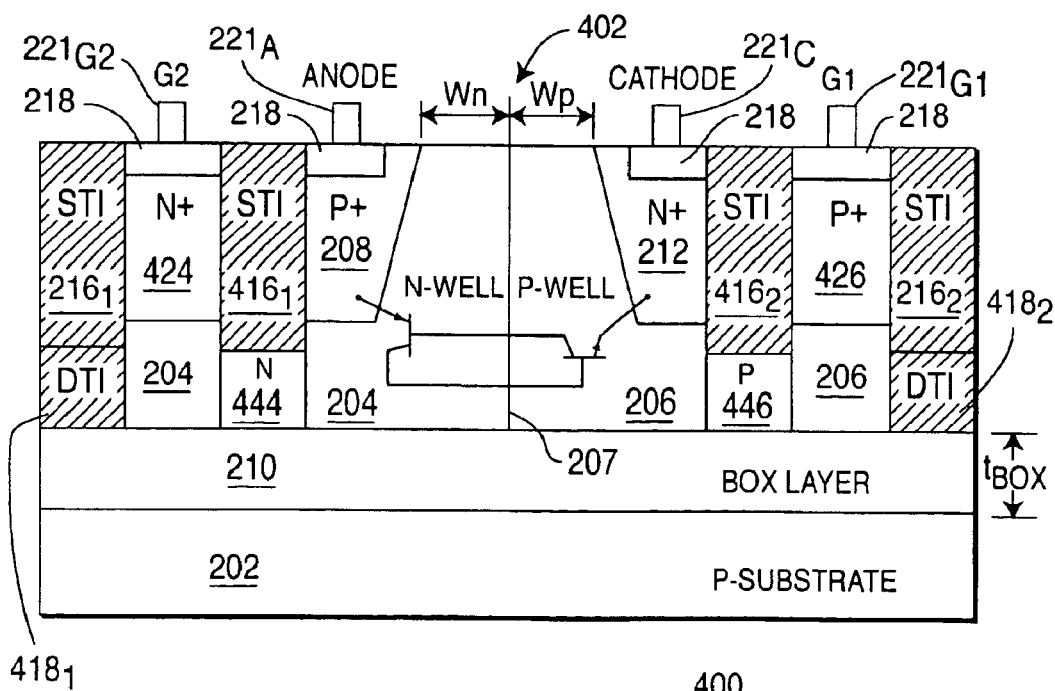
FIG. 4B depicts a cross-sectional view taken along line C—C of the SOI-SCR of FIG. 4A.

FIG. 4A depicts a top view of a third embodiment of the SOI-SCR 400 of the present invention, and FIG. 4B depicts a cross-sectional view taken along line C—C of the SOI-SCR 400 of the FIG. 4A, and should be viewed in conjunction with FIG. 4A. The third embodiment is similar to the first embodiment of FIGS. 2A–2C, except for the various features discussed below, and represents a version of the SOI-SCR for "Body-Slightly-Tied (BST) processing. In particular, BST processing provides significant advantages for NMOS and PMOS transistors, such as a reduced leakage current, a smaller junction capacitance, and a better back-gate bias effect than bulk technology, while also keeping all the advantages of SOI.

The SOI-SCR 400 comprises a P-substrate 202, a buried oxide (BOX) layer 210 disposed over the P-substrate 202, and an N-well 204 and P-well 206 formed over the buried oxide layer 210. It is noted that the buried oxide layer 210 has a thickness in a range of approximately 100 to 400 nanometers.

Deep trench isolation (DTI) and shallow trench isolation (STI) is provided to define the active area 402 of the SCR 400. In particular, DTI regions $418_1$ and $418_2$ extend down to the buried oxide layer 210. STI regions $216_1$ and $216_2$ are respectively formed over the DTI regions $418_1$ and $418_2$, thereby defining the outer boundaries of the active region 402 of the SCR 400. STI regions $416_1$ and $416_2$ are respectively formed in the N-well 204 and P-well 206, such that an N-channel 444 and a P-channel 446 are respectively formed beneath the STI regions $416_1$ and $416_2$. Specifically, the STI trench regions $416_1$ and $416_2$ do not entirely reach through to the buried oxide layer 210. Accordingly, a thin region of silicon remains under the STI regions $416_1$ and $416_2$, termed "partial trench isolation." In one embodiment, the thin regions (i.e., N-channel 444 and P-channel 446) have local doping concentrations slightly greater than the respective N-well and P-well doping concentrations, but less than the doping concentrations of the N+ and P+ regions. In one embodiment, the N-channel 444 and P-channel 446 have a doping concentration in a range of approximately $1\times10^{17}$ to $5\times10^{18}$ cm$^3$.

A doped N+ region 424 forming a second gate G2 is formed between STI regions $216_1$ and $416_1$ in the N-well 204. Furthermore, the P+ region 426, which forms the first gate G1 of the SCR 400, is formed in the P-well 206 between the STI regions $416_2$ and $216_2$. The P+ anode region 208 and N+ cathode region 212 are respectively formed in the N-well 204 and P-well 206 adjacent to STI regions $416_1$ and $416_2$. The base width $W_n$ of the PNP transistor Qp is measured from the edge of the P+ region 208 to the junction 207, while the base width $W_p$ of the NPN transistor Qn is measured from the edge of the N+ region 212 to the junction 207 between the N-well 204 and P-well 206.

Each of the N+ and P+ regions is provided with a silicide metallization layer 218, as discussed above with respect to FIGS. 2A–C and 3. Furthermore, a plurality of metal contacts 221 are formed over the silicide layer 218, as also discussed above with respect to the first and second embodiments.

The layout of this third embodiment of FIG. 4A differs from the layout of the first embodiment of FIG. 2A. In one embodiment, the N+ and P+ trigger tap regions 424 and 426 respectively forming the second and first gates (G1 and G2) are formed substantially in parallel with the respective P+ anode region 208 and N+ cathode region 212. That is, in one embodiment, the N+ trigger tap region 424 is formed as rectangular shaped stripe substantially parallel to the rectangular shaped striped P+ anode region 208. Similarly, the P+ trigger tap region 426 is formed as a rectangular shaped stripe substantially parallel to the rectangular shaped striped N+ cathode region 212. In one embodiment, the P+ anode region 208 and N+ trigger tap 424, as well as the N+ cathode region 212 and P+ trigger tap 426, are formed having approximately the same length in the respective N-well 204 and P-well 206.

Referring to FIG. 4B, the layout shown in FIG. 4A is possible because of the formation of the N-channel 444 and P-channel 446. Specifically, the N+ second gate G2 region 424 is indirectly coupled to the N-well 204 through the N-channel 444, while the P+ first gate G1 region 426 is indirectly coupled to the P-well 206 through the P-channel 446. Referring to FIGS. 2A–2C of the first embodiment, no such N-channel 444 or P-channel 446 is present. Thus, in the first embodiment, the trigger taps (gates G1 and G2) must be formed on the ends of the P+ anode and N+ cathode regions 208 and 212. Accordingly, this third embodiment advantageously provides larger areas dedicated to the trigger tap regions, thereby providing a connection along the entire length of the SCR 400, without interrupting the anode/cathode regions 208/212, or reducing their effective length. It is noted that large trigger taps (G1 426 and G2 424) are required when large trigger elements (GGNMOS or diode chain trigger devices) are used in order to enhance the triggering mechanism of the ESD protection, since the trigger tap (either G1 or G2) must be strong enough to withstand the current coming from the trigger device.

In this fourth embodiment of FIGS. 4A and 4B, the SOI-SCR 400 is triggered by an external, on-chip triggering device, as discussed above with respect to the first embodiment of FIGS. 2A–2C. In one embodiment, a GGNMOS or a plurality of serially coupled diodes, as shown in FIGS. 1A and 1B, may be utilized. However, such triggering devices should not be considered as limiting. For example, a PMOS trigger device or other external on-chip triggering device may be utilized to trigger the SOI-SCR 400.

Figure 5A:
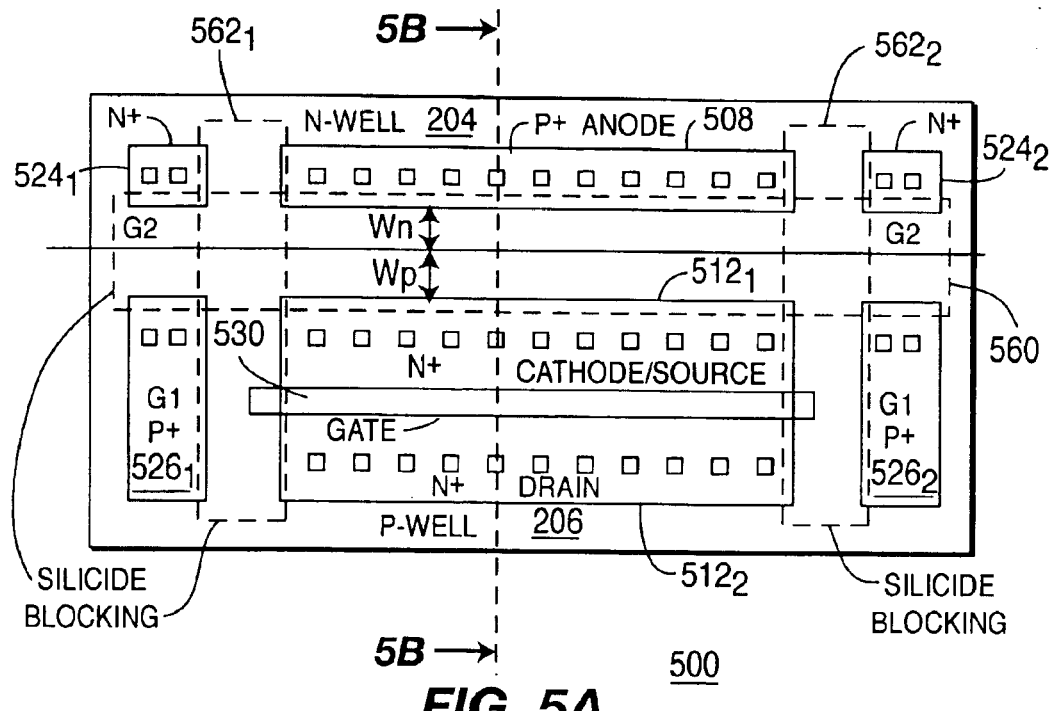
FIG. 5A depicts a top view of a fourth embodiment of the SOI-SCR of the present invention.
Figure 5B:
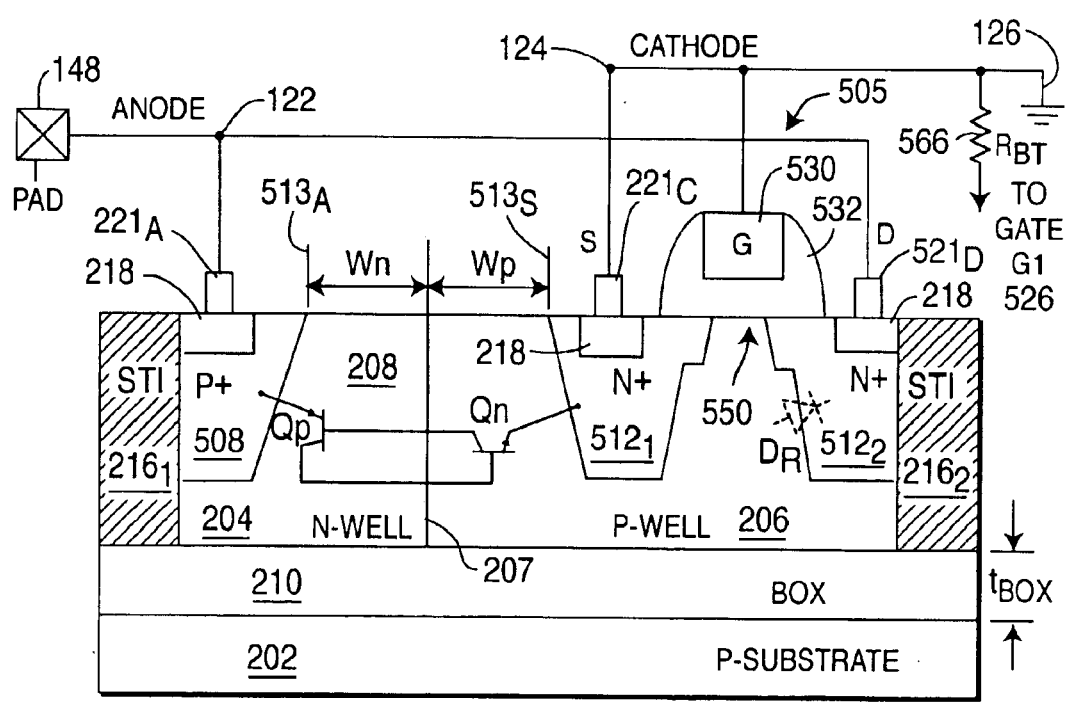
FIG. 5B depicts a cross-sectional view taken along line D—D of the SOI-SCR of FIG. 5A.

FIG. 5A depicts a top view of a fourth embodiment of the SOI-SCR 500 of the present invention. FIG. 5B depicts a cross-sectional view taken along line D—D of the SOI-SCR 500 of FIG. 5A, and should be viewed in conjunction with FIG. 5A. The fourth embodiment of the SOI-SCR 500 comprises a triggering device 505 (i.e., NMOS triggering device) integrally formed with the SCR 500.

Referring to FIG. 5B, the buried insulative layer 210 (e.g., $SiO_2$) is formed over the P-substrate 202, as discussed above with the previous embodiments. The N-well 204 and P-well 206 are formed over the buried oxide (BOX) layer 210 and are electrically isolated from the P-substrate 202. In this fourth embodiment, the BOX layer 210 has a thickness $t_{BOX}$ of approximately 100 to 400 nanometers. The N-well 204 and P-well 206 are formed adjacent to each other and define a junction 207 therebetween. STI regions $216_1$ and $216_2$ form a boundary around the N-well 204 and P-well 206, and extend from a surface of the SCR 500 to the BOX layer 210.

A P+ anode region 508 is formed in the N-well 204, and forms the anode 122 of the SOI-SCR 500. A first N+ (cathode) $512_1$ region and a second N+ (drain) region $512_2$ are formed in the P-well 206, such that a channel 550 is formed therebetween. It is noted that the channel 550 functions as an NMOS channel of an NMOS device. It is further noted that in both the P+ region 508 and N+ regions $512_1$ and $512_2$ do not necessarily extend all the way down to the buried oxide layer 210 as discussed above.

The distance $W_n$ between the edge $513_A$ of the P+ region 508 and the junction 207, as well as the distance $W_p$ between the edge $513_S$ of the first N+ region $512_1$ and the junction 207, define the base widths of the PNP transistor and NPN transistor, as discussed above. The base widths $W_n$ and $W_p$ are formed as close as possible using minimal design rules.

The first N+ region $512_1$ forms the cathode 124 of the SCR 500. Furthermore, the first and second N+ regions $512_1$ and $512_2$ also respectively form a source and drain of the integrally formed NMOS trigger device 505. Specifically, a gate 530 is formed over the first and second N+ regions $512_1$ and $512_2$ and the channel (NMOS channel) 550 formed therebetween. It is noted that the gate 530 is formed over a thin silicon dioxide layer 532, as conventionally known in the art.

Each of the high doped P+ and N+ regions 508, $512_1$, and $512_2$ comprise a silicide layer 218 and a respective contact $221_A$, $221_C$, and $521_D$ disposed thereover, as discussed above with respect to FIG. 2. The contact $221_A$ of the P+ region (anode 122) 508 is coupled to the pad 148 of the IC. The contact $221_C$ of the first N+ region (cathode 124) $512_1$ is coupled to ground 126. Furthermore, the second N+ region $512_2$, which functions as the drain of the NMOS trigger device 505, is also coupled to the pad 148 of the IC via contact $521_D$. The gate 530 of the NMOS trigger device 505 is also coupled to ground 126.

Referring to FIG. 5A, at least one P+ region 526 defining a first gate G1 is formed in the P-well 206, proximate and in-line (e.g., axially in-line) with the first N+ cathode region $512_1$ and second N+ drain region $512_2$. That is, the width of the first gate P+ region 516 is substantially the same as the width of the integrated NMOS trigger device 505. In this fourth embodiment, two P+ first gate regions $526_1$ and $526_2$ are illustratively formed proximate and in-line (e.g., axially in-line) at each end of the first and second N+ regions $512_1$ and $512_2$.

Furthermore, at least one N+ region 524 defining a second gate G2 is formed in the N-well 204, proximate and in-line (e.g., axially in-line) with the P+ anode region 508. Moreover, the width of the N+ second gate G2 region 524 is substantially the same as the width of the P+ anode region 508. In this fourth embodiment, two N+ second gate regions $524_1$ and $524_2$ are formed proximate and in-line (e.g., axially in-line) at each end of the P+ anode region 508, however such configuration should not be considered as being limiting.

It is noted that silicide blocking is provided along the junction 207 between the N-well 204 and P-well 206. That is, silicide blocking is provided on the surface over the area between the P+ anode region 508 and the first N+ cathode (source) region $512_1$, as well as between the first and second P+ and N+ gate regions 524 and 526, as shown by the rectangular portion 560 (drawn in phantom). Furthermore, silicide blocking is also provided between the P+ first gate regions $526_1$ and $526_2$ and the end portions of the first and second N+ (cathode and drain) regions $512_1$ and $512_2$, as well as the N+ second gate regions $524_1$ and $524_2$ and the end portions of the P+ anode region 508, as shown by the rectangular portions $562_1$ and $562_2$ (drawn in phantom). As noted above, silicide blocking is provided to prevent shorting between the high doped regions.

In the embodiment of FIGS. 5A and 5B, The NMOS trigger device 505 is a grounded gate NMOS trigger device. Specifically, the first N+ source region $512_1$ and the gate region 530 are coupled together at ground 126. Furthermore, an external, on-chip body-tie resistor $R_{BT}$ 566 is coupled between the source $512_1$ and gate 530 to the first gate G1 regions $526_1$ and $526_2$. In one embodiment, the body-tie resistor $R_{BT}$ 566 is fabricated from polysilicon and has a resistance value in the range between 200 to 10,000 ohms. The body-tie resistor $R_{BT}$ 566 is provided to enhance the triggering of the integrated NMOS for which the P-well 206 forms the bulk, and the G1 region 526 serves as the bulk connection. Specifically, a higher bulk resistance increases the triggering speed and decreases the triggering voltage of the NMOS trigger device 505.

During normal circuit operation of the IC, the SOI-SCR 500 is turned off, and the SOI-SCR 500 does not interfere (i.e., shunt current to ground) with the functional operations of the IC circuitry. During an ESD event occurring at the pad 148, the second N+ region 512$_2$ forming the drain of the GGNMOS trigger device 505 and the P-well 206 are reversed biased. That is, the P-well 206 and N+ region 512$_2$ form a reverse biased diode, as represented by diode D$_R$ (drawn in phantom) in FIG. 5B. An ESD voltage applied to the drain of the GGNMOS 505 causes an avalanche condition, thereby injecting carriers into the base (P-well 206) of the NPN transistor Qn. Once the base-emitter of the NPN transistor Qn turns on, the collector (N-well 204) of the NPN transistor Qn provides carriers to the base (also N-well 204) of the PNP transistor Qp, and forward biases the base/emitter diode of the PNP transistor Qp, providing current feedback to the NPN transistor Qn, as conventionally known in the art.

Thus, the fourth embodiment of the SOI-SCR 500 provides ESD protection faster than a bulk SCR not having the buried insulator layer 210 because of the faster, and lower voltage triggering of the integrated NMOS. Moreover, the integrated NMOS can drive a significant amount of current, which increase the total the current capability of the ESD protection.

Although various embodiments that incorporate the teachings of the present invention have been shown and described in detail herein, those skilled in the art can readily devise many other varied embodiments that still incorporate these teachings.

What is claimed is:

1. An electrostatic discharge (ESD) protection circuit in a semiconductor integrated circuit (IC) having protected circuitry, the ESD protection circuit comprising:
   an SCR for shunting ESD current away from said protected circuitry, said SCR comprising:
      a substrate;
      an N-well and an adjacent P-well formed over said substrate and defining a PN junction therebetween;
      an insulator layer formed over said substrate and electrically isolating said N-well and P-well from said substrate;
      an N+ cathode region formed in said P-well and for coupling to ground;
      a P+ anode region formed in said N-well and for coupling to a pad of said protected circuitry;
      at least one P+ trigger tap region disposed in said P-well and spaced proximate to said N+ cathode region, said at least one P+ trigger tap being adapted to trigger said SCR; and
      at least one N+ trigger tap region disposed in said N-well and spaced proximate to said P+ anode region, said at least one N+ trigger tap being adapted to trigger said SCR.

2. The ESD protection circuit of claim 1, wherein said at least one P+ trigger tap region comprises two P+ trigger tap regions, where each P+ trigger tap region is disposed axially in-line and at opposing ends of said N+ cathode region in said P-well.

3. The ESD protection circuit of claim 1, wherein said at least one N+ trigger tap region comprises two N+ trigger tap regions, where each N+ trigger tap region is disposed axially in-line and at opposing ends of said P+ anode region in said N-well.

4. The ESD protection circuit of claim 1, wherein said insulator layer is selected from the group of materials comprising SiO$_2$ and sapphire.

5. The ESD protection circuit of claim 1, wherein a surface area over a non-high-doped region and between the N+ cathode region and the P+ anode region is shallow trench isolation (STI) blocked.

6. The ESD protection circuit of claim 1, wherein a surface area of the N-well and P-well between the N+ cathode region and the P+ anode region is silicide blocked.

7. The ESD protection circuit of claim 1, wherein said SCR is self-triggering, in an instance where said at least one P+ trigger tap and N+ trigger tap are respectively coupled to said N+ cathode and P+ anode, and wherein a voltage applied across said N+ trigger tap region and said P+ trigger tap has a potential exceeding a threshold to create a depletion region formed entirely between said N+ cathode region formed in said P-well and said P+ anode region formed in said N-well.

8. The ESD protection circuit of claim 7, wherein said depletion region comprises:
   a first depletion layer formed at a P+N junction proximately between the P+ anode region and the N-well in an instance where said P+ anode and said N-well are at a same potential;
   a second depletion layer formed at a PN+ junction proximately between the N+ cathode region and the P-well, in an instance where said P-well and N+ cathode region are at a same potential; and
   a third depletion layer formed proximately between the said P-well and N-well, in an instance where said PN junction is reversed biased.

9. The ESD protection circuit of claim 8, wherein in an instance where said third depletion layer reaches said first and second depletion layers, said N-well and P-well between said P+ anode and N+ cathode regions are entirely depleted of carriers and become intrinsically conducting to form said depletion region.

10. The ESD protection circuit of claim 1, wherein an N-channel is formed in said N-well between said P+ anode region and said insulator layer, and a P-channel is formed in said P-well between said N+ cathode region and said insulator layer.

11. The ESD protection circuit of claim 10, wherein said N-channel and P-channel respectively have higher doping concentrations than the N-well and P-well.

12. The ESD protection circuit of claim 11, wherein a first STI region and a second STI region are respectively formed over a portion of said N-channel and said P-channel.

13. The ESD protection circuit of claim 12, wherein said first STI region is formed between said at least one N+ trigger tap region and said P+ anode region, and said second STI region is formed between said at least one P+ trigger tap region and said N+ cathode region.

14. The ESD protection circuit of claim 13, wherein said at least one P+ trigger tap region extends a length parallel to said N+ cathode region in said P-well.

15. The ESD protection circuit of claim 14, wherein said at least one N+ trigger tap region extends a length parallel to said P+ anode region in said N-well.

16. The ESD protection circuit of claim 1, further comprising:
   a triggering device having at least a first and second terminal coupled to the SCR, wherein said first terminal is for coupling to the pad and said second terminal is coupled to said at least one P+ trigger tap region.

17. The ESD protection circuit of claim 16, wherein the triggering device comprises a NMOS transistor wherein a source and a drain of the NMOS transistor are respectively coupled to said P+ trigger-tap region and for coupling to the pad.

18. The ESD protection circuit of claim 17, wherein a gate of the NMOS is coupled to the source of the NMOS transistor.

19. The ESD protection circuit of claim 16, wherein the triggering device comprises at least one diode serially coupled in a forward conduction direction between said pad and said at least one P+ trigger tap.

20. The ESD protection circuit of claim 1, further comprising:
a triggering device having at least a first and second terminal coupled to the SCR, wherein said first terminal is for coupling to ground and said second terminal is coupled to said at least one N+ trigger tap region.

21. The ESD protection circuit of claim 20, wherein the triggering device comprises a PMOS transistor wherein a source and a drain of the PMOS transistor are respectively coupled to said N+ trigger-tap region and for coupling to ground.

22. The ESD protection circuit of claim 21, wherein a gate of the PMOS is coupled to the source of the PMOS transistor.

23. The ESD protection circuit of claim 20, wherein the triggering device comprises at least one diode serially coupled in a forward conduction direction between ground and said at least one N+ trigger tap.

24. The ESD protection circuit of claim 1, further comprising at least one PN junction diode serially coupled in a forward conduction direction between said pad and said P+ anode region.

25. An electrostatic discharge (ESD) protection circuit in a semiconductor integrated circuit (IC) having protected circuitry, the ESD protection circuit comprising:
an SCR for shunting ESD current away from said protected circuitry, said SCR comprising:
a substrate;
an N-well and an adjacent P-well formed over said substrate and defining a PN junction therebetween;
an insulator layer formed over said substrate and electrically isolating said N-well and P-well from said substrate;
an N+ cathode region formed in said P-well and coupled to ground;
a P+ anode region formed in said N-well and coupled to a pad of said protected circuitry;
an integrated trigger device, comprising:
an N+ drain region, formed in said P-well and coupled to said pad, and defining an NMOS channel therebetween said N+ cathode region;
a gate region, coupled to said N+ cathode region, and disposed over said NMOS channel;
at least one P+ trigger tap region disposed in said P-well and spaced proximate to said N+ cathode region and said N+ drain region, said at least one P+ trigger tap being adapted to trigger said SCR; and
at least one N+ trigger tap region disposed in said N-well and spaced proximate to said P+ anode region, said at least one N+ trigger tap being adapted to trigger said SCR.

26. The ESD protection circuit of claim 25, wherein said at least one P+ trigger tap region comprises two P+ trigger tap regions, where each P+ trigger tap region is disposed axially in-line and at opposing ends of said N+ cathode region and said N+ drain region in said P-well.

27. The ESD protection circuit of claim 26, wherein said at least one N+ trigger tap region comprises two N+ trigger tap regions, where each N+ trigger tap region is disposed axially in-line and at opposing ends of said P+ anode region in said N-well.

28. The ESD protection circuit of claim 25, wherein said insulator layer is selected from the group of materials consisting of $SiO_2$ and sapphire.

29. The ESD protection circuit of claim 25, wherein a surface area over a non-high-doped region and between the N+ cathode region and the P+ anode region is shallow trench isolation (STI) blocked.

30. The ESD protection circuit of claim 25, wherein a surface area of the N-well and P-well between the N+ cathode region and the P+ anode region is silicide blocked.

31. The ESD protection circuit of claim 25, further comprising at least one PN junction diode serially coupled in a forward conduction direction between said pad and said P+ anode region.

* * * * *